United States Patent
Chen et al.

(10) Patent No.: US 11,606,019 B2
(45) Date of Patent: Mar. 14, 2023

(54) CONTROL CIRCUIT, VOLTAGE SOURCE CIRCUIT, DRIVING DEVICE, AND DRIVING METHOD

(71) Applicant: Huawei Digital Power Technologies Co., Ltd., Shenzhen (CN)

(72) Inventors: Dong Chen, Shanghai (CN); Lei Shi, Shanghai (CN); Zhaohui Wang, Nuremberg (DE)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/495,112

(22) Filed: Oct. 6, 2021

(65) Prior Publication Data
US 2022/0029522 A1    Jan. 27, 2022

Related U.S. Application Data

(63) Continuation of application No. PCT/CN2020/084365, filed on Apr. 13, 2020.

(30) Foreign Application Priority Data

Apr. 16, 2019 (CN) .......................... 201910304610.3

(51) Int. Cl.
*H03K 3/00* (2006.01)
*H03K 17/16* (2006.01)
(Continued)

(52) U.S. Cl.
CPC ........... *H02M 1/0054* (2021.05); *H02M 1/08* (2013.01); *H03K 17/16* (2013.01)

(58) Field of Classification Search
None
See application file for complete search history.

(56) References Cited

U.S. PATENT DOCUMENTS 7,265,601 B2    9/2007   Ahmad
7,615,940 B2   11/2009   Qiu et al.
(Continued)

FOREIGN PATENT DOCUMENTS

CN    1139997 A    1/1997
CN    1256556 A    6/2000
(Continued)

OTHER PUBLICATIONS

Office Action dated Dec. 3, 2020, in connection with corresponding Chinese Application No. 201910304610.3 (13 pp., including machine-generated English translation).

(Continued)

*Primary Examiner* — Kenneth B Wells
(74) *Attorney, Agent, or Firm* — Maier & Maier, PLLC (57) ABSTRACT

A control circuit includes a detection module configured to detect an operating condition of a semiconductor switching device; a determining module configured to determine a gate allowable voltage of the semiconductor switching device based on the operating condition; and an output module configured to output a control signal to a driving power supply circuit of the semiconductor switching device based on the gate allowable voltage, to control the driving power supply circuit to provide a gate on voltage that is not higher than the gate allowable voltage and that is positively correlated with the gate allowable voltage for the semiconductor switching device. When the operating condition of the semiconductor switching device becomes better, the gate allowable voltage of the semiconductor switching device is increased.

12 Claims, 7 Drawing Sheets

(51) Int. Cl.
  *H02M 1/00* (2006.01)
  *H02M 1/08* (2006.01)

(56) References Cited

U.S. PATENT DOCUMENTS

| | | | |
|---|---|---|---|
| 7,701,189 B2* | 4/2010 | Gehrke | H02M 3/1588 |
| | | | 323/283 |
| 8,970,200 B2* | 3/2015 | Hussain | G09G 3/3406 |
| | | | 345/82 |
| 9,570,985 B2 | 2/2017 | Sato et al. | |
| 2010/0176783 A1 | 7/2010 | Tagome | |
| 2011/0234185 A1 | 9/2011 | Nagase et al. | |
| 2012/0293218 A1 | 11/2012 | Dewa et al. | |
| 2018/0109255 A1* | 4/2018 | Lee | H03K 19/00315 |
| 2020/0041356 A1* | 2/2020 | Neidorff | H03K 17/145 |

FOREIGN PATENT DOCUMENTS

| | | |
|---|---|---|
| CN | 101088221 A | 12/2007 |
| CN | 101192797 A | 6/2008 |
| CN | 102201730 A | 9/2011 |
| CN | 102280989 A | 12/2011 |
| CN | 108259027 A | 7/2018 |
| CN | 110071620 A | 7/2019 |
| EP | 2 385 628 A2 | 11/2011 |
| JP | 2014147237 A | 8/2014 |
| JP | 2015080335 A | 4/2015 |
| TW | I301012 B | 9/2008 |
| WO | 2006023912 A2 | 3/2006 |

OTHER PUBLICATIONS

Notification to Grant Patent Right for Invention dated Jun. 3, 2021, in connection with corresponding Chinese Application No. 201910304610.3 (4 pp., including machine-generated English translation).

Wu et al. "Temperature adaptive IGBT gate-driver design" Proceedings of the 2011 14th European Conference on Power Electronics and Applications. 2011. 6 pages.

* cited by examiner

CONTROL CIRCUIT, VOLTAGE SOURCE CIRCUIT, DRIVING DEVICE, AND DRIVING METHOD

CROSS-REFERENCE TO RELATED APPLICATIONS

This application is a continuation of International Application No. PCT/CN2020/084365, filed on Apr. 13, 2020, which claims priority to Chinese Patent Application No. 201910304610.3, filed on Apr. 16, 2019. The disclosures of the aforementioned applications are hereby incorporated by reference in their entireties.

TECHNICAL FIELD

The embodiments relate to the field of electronic technologies, and in particular, to a control circuit, a voltage source circuit, a driving device, and a driving method.

BACKGROUND

A switching power supply performs pulse modulation on an input voltage by switching a semiconductor switching device between a full-on mode and a full-off mode under control of a control circuit, thereby implementing voltage conversion from an alternating current to a direct current, from a direct current to a direct current, from a direct current to an alternating current, or from an alternating current to an alternating current. Therefore, the switching power supply is widely used in the fields of display, lighting, communication, refrigeration, and the like.

When a gate driving voltage of the semiconductor switching device is a gate on voltage Von higher than a threshold voltage of the semiconductor switching device, the semiconductor switching device is in the full-on mode; and when the gate driving voltage is a gate off voltage Voff lower than the threshold voltage of the semiconductor switching device, the semiconductor switching device is in the full-off mode. When the gate driving voltage of the semiconductor switching device is switched from the Voff to the Von and then switched from the Von to the Voff again, the semiconductor switching device is switched from the full-off mode to the full-on mode and then switched from the full-on mode to the full-off mode again. Particular mode switching duration is required for each of the two types of switching. For a conventional hard switching circuit, the semiconductor switching device has a particular loss during mode switching, which limits an operating frequency of the switching power supply. To reduce the loss of the switching power supply, it is necessary to shorten the mode switching duration of the semiconductor switching device.

The mode switching duration of the semiconductor switching device is generally related to a difference between the gate on voltage and the gate off voltage of the semiconductor switching device. A larger difference between the gate on voltage and the gate off voltage indicates shorter switching duration. Conversely, a smaller difference between the gate on voltage and the gate off voltage indicates longer switching duration. For a switching power supply of the semiconductor switching device of which the gate off voltage is a constant value, the gate on voltage should be increased to shorten the mode switching duration. In a conventional technology, a gate on voltage provided by a driving circuit of the semiconductor switching device is also a constant value, and the driving circuit generally provides a relatively low gate on voltage because an operating condition such as an operating temperature of the semiconductor switching device is changed, to ensure that breakdown does not occur on the semiconductor switching device even if the semiconductor switching device works under an extreme condition (referring to an operating condition under which breakdown is most likely to occur).

However, the semiconductor switching device generally works more under a non-extreme condition. In this case, the gate on voltage set based on the extreme condition is relatively low, which is not conducive to shortening the mode switching duration of the semiconductor switching device, and therefore is not conducive to reducing the loss of the switching power supply.

SUMMARY

Embodiments provide a control circuit, a voltage source circuit, a driving device, and a driving method, to resolve a problem of a relatively large loss of a switching power supply caused by an excessively low gate on voltage.

A first aspect of the embodiments provides a control circuit, including: a detection module configured to detect a current operating condition of a semiconductor switching device; a determining module configured to determine a gate allowable voltage of the semiconductor switching device based on the operating condition detected by the detection module; and an output module configured to output a control signal to a driving power supply circuit of the semiconductor switching device based on the gate allowable voltage determined by the determining module, to control the driving power supply circuit to provide a gate on voltage that is not higher than the gate allowable voltage and that is positively correlated with the gate allowable voltage for the semiconductor switching device.

With reference to the first aspect of the embodiments, in a first possible implementation of the first aspect of the embodiments, the determining module includes: a first gate allowable voltage determining submodule, configured to determine a first value of the gate allowable voltage based on the operating condition detected by the detection module, where the first value is not higher than a gate breakdown voltage of the semiconductor switching device.

With reference to the first possible implementation of the first aspect of the embodiments, in a second possible implementation of the first aspect, the first gate allowable voltage determining submodule includes a gate breakdown voltage determining unit configured to determine the gate breakdown voltage of the semiconductor switching device based on the operating condition detected by the detection module; and a first gate allowable voltage determining unit configured to determine the first value based on the gate breakdown voltage determined by the gate breakdown voltage determining unit and a preset first margin.

With reference to the first possible implementation or the second possible implementation of the first aspect of the embodiments, in a third possible implementation of the first aspect of the embodiments, the determining module further includes a second gate allowable voltage determining submodule configured to determine a second value of the gate allowable voltage based on an allowable voltage between two ends of a conduction channel of the semiconductor switching device and the operating condition detected by the detection module; and a third gate allowable voltage determining submodule configured to determine the gate allowable voltage based on a smaller value between the first value determined by the first gate allowable voltage determining submodule and the second value determined by the second gate allowable voltage determining submodule.

With reference to the third possible implementation of the first aspect of the embodiments, in a fourth possible implementation of the first aspect of the embodiments, the determining module further includes: a channel allowable voltage determining submodule configured to determine the allowable voltage between the two ends of the conduction channel based on the operating condition detected by the detection module, where the allowable voltage between the two ends of the conduction channel is not higher than a breakdown voltage between the two ends of the conduction channel.

With reference to the fourth possible implementation of the first aspect of the embodiments, in a fifth possible implementation of the first aspect of the embodiments, the channel allowable voltage determining submodule includes a channel breakdown voltage determining unit configured to determine the breakdown voltage between the two ends of the conduction channel based on the operating condition detected by the detection module; and a channel allowable voltage determining unit configured to determine the allowable voltage between the two ends of the conduction channel based on the breakdown voltage between the two ends of the conduction channel determined by the channel breakdown voltage determining unit and a preset second margin.

With reference to any one of the third possible implementation or the fourth possible implementation or the fifth possible implementation of the first aspect, in a sixth possible implementation of the first aspect of the embodiments, the semiconductor switching device is a metal oxide semiconductor field effect transistor (MOSFET), and the two ends of the conduction channel include a drain electrode and a source electrode of the MOSFET; or the semiconductor switching device is an insulated gate bipolar transistor (IGBT), and the two ends of the conduction channel include a collector and an emitter of the IGBT.

With reference to the first aspect or any one of the first possible implementation to the sixth possible implementation of the first aspect, in a seventh possible implementation of the first aspect, the operating condition includes an operating temperature of the semiconductor switching device, or an operating temperature and an operating current of the semiconductor switching device, or an operating temperature and an operating platform voltage of the semiconductor switching device, or an operating temperature, an operating current, and an operating platform voltage of the semiconductor switching device.

A second aspect provides a voltage source circuit, including a control circuit and a driving power supply circuit, where the driving power supply circuit is configured to provide a gate on voltage for a semiconductor switching device under control of the control circuit, and the control circuit is the control circuit according to any possible implementation in the first aspect of the embodiments.

A third aspect provides a driving device of a semiconductor switching device, including: a driving circuit and a voltage source circuit, where the voltage source circuit includes a driving power supply circuit and the control circuit according to any possible implementation in the first aspect of the embodiments; the driving power supply circuit is configured to provide a gate on voltage for the driving circuit under control of a control signal output by the control circuit; and the driving circuit is configured to output the gate on voltage to a semiconductor switching device when receiving an on control signal, to drive the semiconductor switching device to be turned on, and output a gate off voltage to the semiconductor switching device when receiving an off control signal, to drive the semiconductor switching device to be turned off.

A fourth aspect provides a method for driving a semiconductor switching device, including: a control circuit obtains a current operating condition of a semiconductor switching device; the control circuit determines a gate allowable voltage of the semiconductor switching device based on the operating condition; and the control circuit outputs a control signal to a driving power supply circuit of the semiconductor switching device based on the gate allowable voltage, to control the driving power supply circuit to provide a gate on voltage that is not higher than the gate allowable voltage and that is positively correlated with the gate allowable voltage for the semiconductor switching device.

With reference to the fourth aspect, in a first possible implementation of the fourth aspect of the embodiments, the determining, by the control circuit, a gate allowable voltage of the semiconductor switching device based on the operating condition includes: the control circuit determines a first value of the gate allowable voltage based on the operating condition, where the first value is not higher than a gate breakdown voltage of the semiconductor switching device.

With reference to the first possible implementation of the fourth aspect, in a second possible implementation of the fourth aspect, the determining, by the control circuit, a first value of the gate allowable voltage based on the operating condition includes: the control circuit determines the gate breakdown voltage of the semiconductor switching device based on the operating condition; and the control circuit determines the first value based on the gate breakdown voltage and a preset first margin.

With reference to the first possible implementation or the second possible implementation of the fourth aspect, in a third possible implementation of the fourth aspect, the method further includes: the control circuit determines a second value of the gate allowable voltage based on an allowable voltage between two ends of a conduction channel of the semiconductor switching device and the operating condition; and the control circuit determines the gate allowable voltage based on a smaller value between the first value and the second value.

With reference to the third possible implementation of the fourth aspect, in a fourth possible implementation of the fourth aspect, the method further includes: the control circuit determines the allowable voltage between the two ends of the conduction channel based on the operating condition, where the allowable voltage between the two ends of the conduction channel is not higher than a breakdown voltage between the two ends of the conduction channel.

With reference to the fourth possible implementation of the fourth aspect, in a fifth possible implementation of the fourth aspect of the embodiments, the determining, by the control circuit, the allowable voltage between the two ends of the conduction channel based on the operating condition includes: the control circuit determines the breakdown voltage between the two ends of the conduction channel based on the operating condition; and the control circuit determines the allowable voltage between the two ends of the conduction channel based on the breakdown voltage between the two ends of the conduction channel and a preset second margin.

With reference to the third possible implementation or the fourth possible implementation or the fifth possible implementation of the fourth aspect, in a sixth possible implementation of the fourth aspect of the embodiments, the semiconductor switching device is a metal oxide semiconductor field effect transistor (MOSFET), and the two ends of the conduction channel include a drain electrode and a source electrode of the MOSFET; or the semiconductor switching device is an insulated gate bipolar transistor (IGBT), and the two ends of the conduction channel include a collector and an emitter of the IGBT.

With reference to the fourth aspect or any one of the first possible implementation to the sixth possible implementation of the fourth aspect, in a seventh possible implementation of the fourth aspect, the operating condition includes an operating temperature of the semiconductor switching device, or an operating temperature and an operating current of the semiconductor switching device, or an operating temperature and an operating platform voltage of the semiconductor switching device, or an operating temperature, an operating current, and an operating platform voltage of the semiconductor switching device.

It can be understood from the foregoing solutions that, in the control circuit provided in the embodiments, the detection module can detect the current operating condition of the semiconductor switching device, the determining module can determine the gate allowable voltage of the semiconductor switching device based on the operating condition detected by the detection module, and the output module can output the control signal to the driving power supply circuit of the semiconductor switching device based on the gate allowable voltage determined by the determining module, to control the driving power supply circuit to provide the gate on voltage that is not higher than the gate allowable voltage and that is positively correlated with the gate allowable voltage for the semiconductor switching device. When the operating condition of the semiconductor switching device becomes better, the gate allowable voltage of the semiconductor switching device is increased. In this case, the control circuit can control the driving power supply circuit to provide an increased gate on voltage that is not higher than the gate allowable voltage for the semiconductor switching device, which is beneficial to shortening mode switching duration of the semiconductor switching device for switching between a full-on mode and a full-off mode, and improving conduction performance of the semiconductor switching device in the full-on mode while ensuring reliability of the semiconductor switching device, thereby reducing a loss of a switching power supply.

DETAILED DESCRIPTION OF THE EMBODIMENTS

The following describes embodiments with reference to accompanying drawings. The described embodiments are merely a part, rather than all of the embodiments. A person of ordinary skill in the art may know that, as technologies develop and a new scenario emerges, the solutions provided in the embodiments are also applicable to similar problems.

The embodiments provide a control circuit. When an operating condition of a semiconductor switching device becomes better, the control circuit can control a driving power supply circuit to increase a gate on voltage provided for the semiconductor switching device, to shorten mode switching duration of the semiconductor switching device for switching between a full-on mode and a full-off mode, thereby reducing a loss. The embodiments further provide a voltage source circuit, a driving device, and an electronic device. The control circuit provided in the embodiments may be disposed in the voltage source circuit, the voltage source circuit provided in the embodiments may be disposed in the driving device provided in the embodiments, and the driving device provided in the embodiments may be disposed in the electronic device. The following first describes the electronic device provided in the embodiments.

Figure 1:
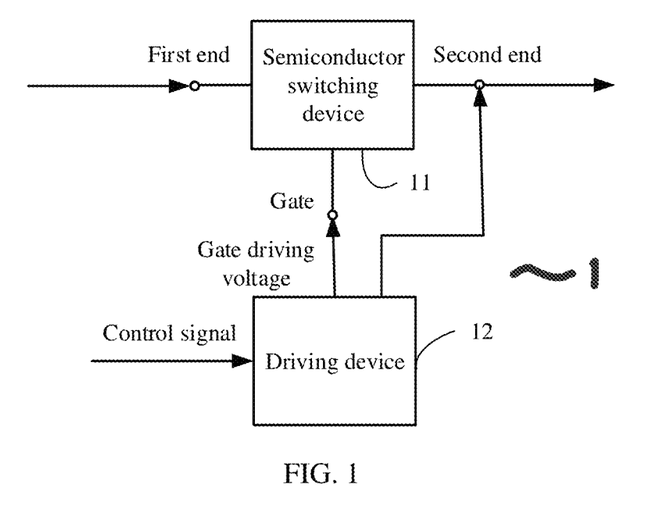
FIG. 1 is a schematic diagram of an embodiment of an electronic device.

FIG. 1 is a schematic diagram of an embodiment of an electronic device. Referring to FIG. 1, an embodiment of an electronic device 1 may include a semiconductor switching device 11 and a driving device 12. The driving device 12 is configured to output a gate driving voltage to a gate of the semiconductor switching device 11 and one end of a conduction channel based on a received control signal. For example, the driving device outputs a gate on voltage to the semiconductor switching device 11 when receiving an on control signal and outputs a gate off voltage to the semiconductor switching device 11 when receiving an off control signal, where the gate on voltage is higher than a threshold voltage of the semiconductor switching device 11, and the gate off voltage is lower than the threshold voltage of the semiconductor switching device 11. In FIG. 1, a first end and a second end of the semiconductor switching device 11 correspond to two ends of the conduction channel of the semiconductor switching device. The semiconductor switching device 11 is turned on or off between the first end and the second end under driving of the gate driving voltage. For example, the conduction channel is formed between the first end and the second end under the driving of the gate on voltage to turn on the semiconductor switching device, and the conduction channel is cut off between the first end and the second end under the driving of the gate off voltage to turn off the semiconductor switching device. In FIG. 1, for example, the driving device 12 outputs the gate driving voltage to the gate and the second end of the semiconductor switching device 11. In actual application, a person skilled in the art may select, based on a structure and a circuit design requirement of the semiconductor switching device 11, to output the gate driving voltage to the gate and the first end of the semiconductor switching device, or to output the gate driving voltage to the gate and the second end of the semiconductor switching device. This is not limited herein.

For example, the semiconductor switching device 11 in the electronic device 1 provided in this embodiment may be a metal oxide semiconductor field effect transistor (metal-oxide-semiconductor field-effect transistor, MOSFET) or an insulated gate bipolar transistor (insulated gate bipolar transistor, IGBT). If the semiconductor switching device 11 is the MOSFET, the first end and the second end of the semiconductor switching device 11 correspond to a drain electrode and a source electrode at the two ends of the conduction channel of the MOSFET. If the semiconductor switching device 11 is the IGBT, the first end and the second end of the semiconductor switching device 11 correspond to a collector and an emitter at the two ends of the conduction channel of the IGBT.

The electronic device 1 provided in this embodiment may be a switching power supply. The switching power supply performs pulse modulation on an input direct current power or alternating current power by switching the semiconductor switching device between a full-on mode and a full-off mode under control of a control signal, thereby implementing conversion from primary electric energy of a power grid or a battery to secondary electric energy meeting a load requirement. An input end of the switching power supply may be connected to the direct current power or the alternating current power, and an output end of the switching power supply may output the direct current power or the alternating current power to a load.

The following describes the driving device 12 provided in the embodiments.

Figure 2:
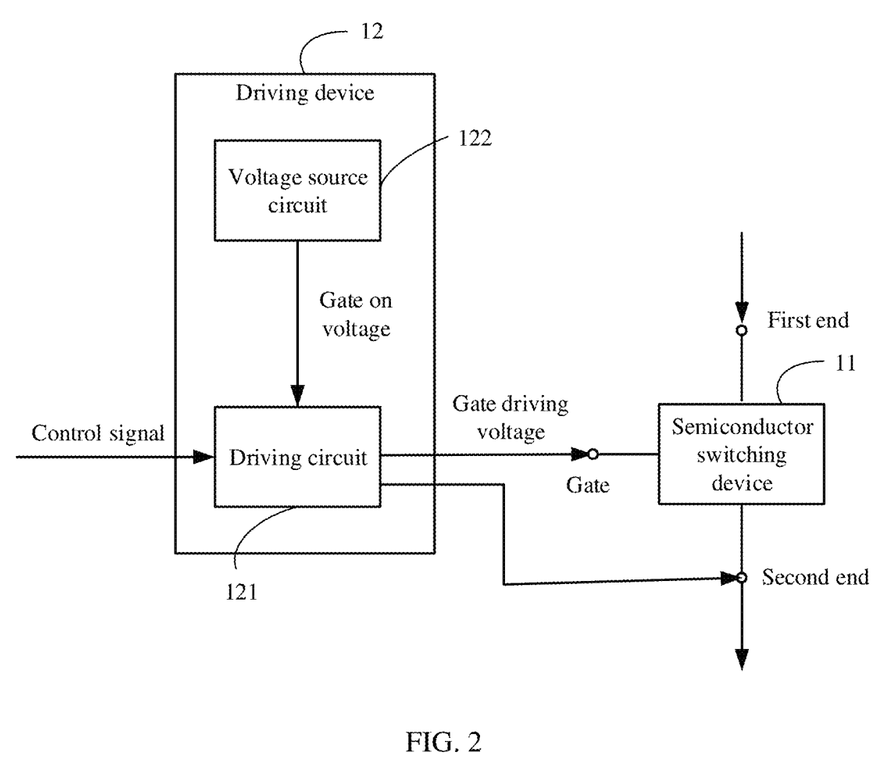
FIG. 2 is a schematic diagram of an application scenario of a driving device according to an embodiment.

FIG. 2 is a schematic diagram of an application scenario of a driving device 12. Referring to FIG. 2, an embodiment of the driving device 12 includes a driving circuit 121 and a voltage source circuit 122. The voltage source circuit 122 is configured to provide a gate on voltage for the driving circuit 121, and the driving circuit 121 is configured to receive a control signal and output a gate driving voltage to a gate of the semiconductor switching device 11 and one end (the second end of the semiconductor switching device 11 is used as an example in FIG. 2) of a conduction channel based on the received control signal, to drive the semiconductor switching device 11 to be turned on or off between the first end and the second end. For example, the driving circuit 121 outputs the gate on voltage provided by the voltage source circuit 122 to the gate and the second end of the semiconductor switching device 11 when receiving an on control signal, to drive the semiconductor switching device 11 to be turned on between the first end and the second end, and outputs a gate off voltage to the gate and the second end of the semiconductor switching device 11 when receiving an off control signal, to drive the semiconductor switching device 11 to be turned off between the first end and the second end. For example, the gate off voltage may be a ground level or a constant negative level.

When the control signal received by the driving circuit 121 is changed from the off control signal to the on control signal, the gate driving voltage output by the driving circuit 121 to the semiconductor switching device 11 is changed from the gate off voltage to the gate on voltage. In this case, a voltage between the gate and the second end of the semiconductor switching device 11 is gradually increased from the gate off voltage to the gate on voltage after a particular period of time, and the semiconductor switching device 11 is switched from a full-off mode to a full-on mode. When the control signal received by the driving circuit 121 is changed from the on control signal to the off control signal, the gate driving voltage output by the driving circuit 121 to the semiconductor switching device 11 is changed from the gate on voltage to the gate off voltage. In this case, the voltage between the gate and the second end of the semiconductor switching device 11 is gradually reduced from the gate on voltage to the gate off voltage after a particular period of time, and the semiconductor switching device 11 is switched from the full-on mode to the full-off mode. When mode switching duration of the semiconductor switching device 11 for switching between the full-on mode and the full-off mode is longer, a switching loss of the electronic device 1 is larger. To reduce the loss, the gate on voltage output by the voltage source circuit 122 needs to be increased, to shorten the mode switching duration of the semiconductor switching device 11. However, to ensure the reliability of the semiconductor switching device 11, it is necessary to limit the gate on voltage output by the voltage source circuit 122 to be not higher than a gate allowable voltage of the semiconductor switching device 11. Therefore, the gate on voltage output by the voltage source circuit 122 may be set as close as possible to or even up to the gate allowable voltage of the semiconductor switching device 11, to reduce the loss of the electronic device 1 as much as possible while meeting a reliability requirement.

Figure 3:
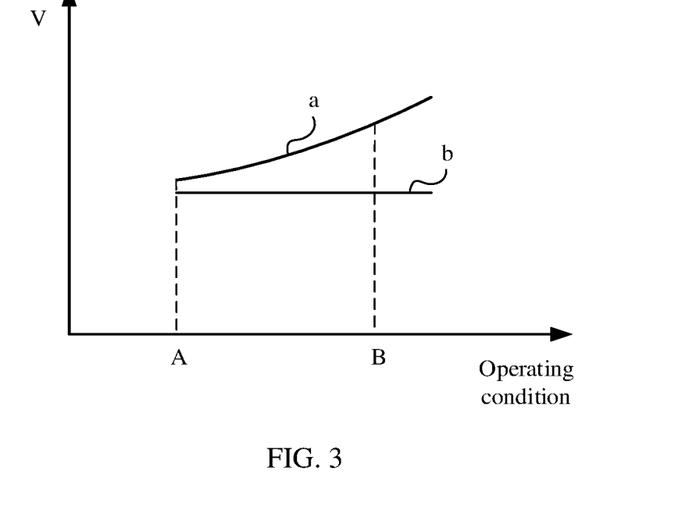
FIG. 3 is a schematic diagram in which a voltage changes with an operating condition.

For a given semiconductor switching device 11, a magnitude of the gate allowable voltage of the semiconductor switching device is mainly affected by an operating condition of the semiconductor switching device, and when the operating condition of the semiconductor switching device 11 is changed, the gate allowable voltage of the semiconductor switching device is generally also changed. A curve a in FIG. 3 represents a schematic diagram in which the gate allowable voltage of the semiconductor switching device 11 changes with the operating condition, and an arrow direction of a horizontal axis in FIG. 3 represents that the operating condition gradually becomes better. It can be seen from the curve a that when the operating condition of the semiconductor switching device 11 becomes better, the gate allowable voltage of the semiconductor switching device is increased, and when the operating condition of the semiconductor switching device 11 becomes worse, the gate allowable voltage of the semiconductor switching device is reduced. In a conventional technology, a gate on voltage provided by the voltage source circuit 122 to the driving circuit 121 is a constant voltage, and because the operating condition of the semiconductor switching device 11 is changed, to ensure the reliability of the semiconductor switching device 11, the gate on voltage provided by the voltage source circuit 122 in the conventional technology is not higher than the gate allowable voltage under a worst operating condition (or referred to as an extreme condition, for example, an operating condition A in FIG. 3). Therefore, in the conventional technology, for a curve in which the gate on voltage provided by the voltage source circuit 122 changes with the operating condition, reference may be made to a straight line b shown in FIG. 3. By comparing the curve a with the straight line b in FIG. 3, it can be seen that when the semiconductor switching device 11 operates in a relatively good operating condition (for example, an operating condition B in FIG. 3), the gate on voltage provided by the voltage source circuit 122 is much lower than the gate allowable voltage of the semiconductor switching device 11. This is not conducive to shortening the mode switching duration of the semiconductor switching device 11, resulting in a relatively high loss for the electronic device 1.

Figure 4:
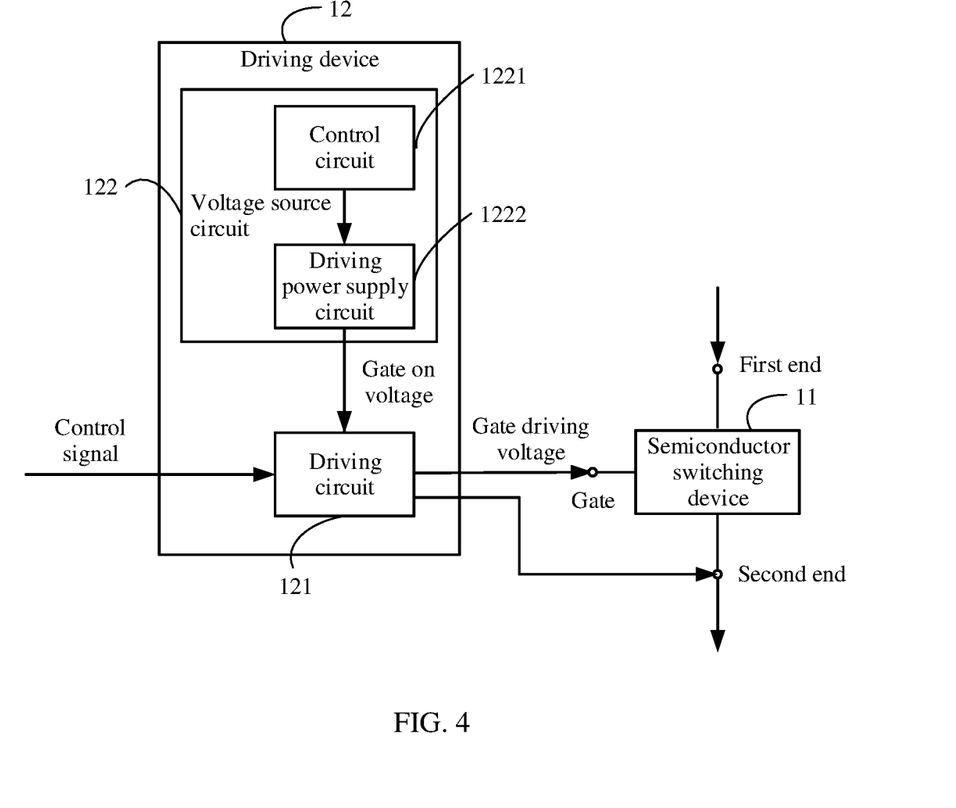
FIG. 4 is a schematic diagram of an application scenario of a voltage source circuit according to an embodiment.

To resolve the foregoing problem, the embodiments provide a voltage source circuit 122. FIG. 4 is a schematic diagram of an application scenario of a voltage source circuit 122. As shown in FIG. 4, the voltage source circuit 122 provided in this embodiment may include a control circuit 1221 and a driving power supply circuit 1222. The control circuit 1221 is configured to output a control signal to the driving power supply circuit 1222 based on the operating condition of the semiconductor switching device 11, and the driving power supply circuit 1222 is configured to provide a gate on voltage that is not higher than a gate allowable voltage and that is positively correlated with the gate allowable voltage for the semiconductor switching device 11 under control of the control signal. For example, the driving power supply circuit 1222 is configured to provide the gate on voltage for the driving circuit 121 under the control of the control signal, and when the driving circuit 121 receives an on control signal, the driving circuit 121 outputs the gate on voltage provided by the driving power supply circuit 1222 to a gate of the semiconductor switching device 11 and one end (the second end of the semiconductor switching device 11 is used as an example in FIG. 4) of the conduction channel. Because the voltage source circuit 122 can adjust the gate on voltage provided for the semiconductor switching device based on the operating condition of the semiconductor switching device 11, when the operating condition of the semiconductor switching device 11 becomes better, the voltage source circuit 122 provides an increased gate on voltage that is not higher than the gate allowable voltage for the semiconductor switching device 11, which is beneficial to shortening the mode switching duration of the semiconductor switching device for switching between the full-on mode and the full-off mode while ensuring the reliability of the semiconductor switching device 11, thereby reducing the loss.

The following describes the control circuit 1221 provided in this embodiment.

First, a function of the control circuit 1221 provided in this embodiment is described by describing a method for driving a semiconductor switching device performed by the control circuit 1221.

Figure 5:
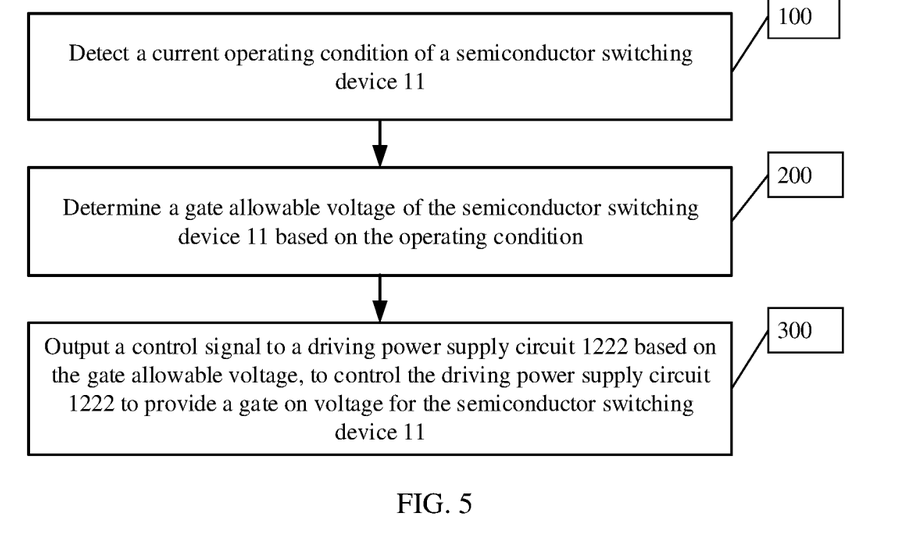
FIG. 5 is a schematic diagram of an embodiment of a method for driving a semiconductor switching device.

FIG. 5 is a schematic diagram of an embodiment of a method for driving a semiconductor switching device. Referring to FIG. 5, an embodiment of the method for driving a semiconductor switching device may include the following steps.

100. Detect a current operating condition of a semiconductor switching device 11.

The control circuit 1221 can detect an operating condition of the semiconductor switching device 11. In a possible implementation, the operating condition may include an operating temperature of the semiconductor switching device 11, or may include an operating temperature and an operating current (a current that passes through a first end and a second end of the semiconductor switching device when the semiconductor switching device 11 is turned on) of the semiconductor switching device 11, or may include an operating temperature and an operating platform voltage (a stability voltage between the first end and the second end when the semiconductor switching device 11 is turned off) of the semiconductor switching device 11, or may include an operating temperature, an operating current, and an operating platform voltage of the semiconductor switching device 11, or may include another specific operating condition. This is not exclusively limited herein.

200. Determine a gate allowable voltage of the semiconductor switching device 11 based on the operating condition.

For a given semiconductor switching device 11, a magnitude of a gate allowable voltage of the semiconductor switching device is mainly affected by the operating condition of the semiconductor switching device, and when the operating condition of the semiconductor switching device 11 is changed, the gate allowable voltage of the semiconductor switching device is generally also changed. In this embodiment, the control circuit 1221 can determine the gate allowable voltage of the semiconductor switching device 11 based on the detected operating condition of the semiconductor switching device 11.

The gate allowable voltage of the semiconductor switching device 11 is generally affected by a plurality of operating conditions of the semiconductor switching device 11, and the operating condition detected by the control circuit 1221 may be some or all of the plurality of operating conditions. When the operating condition detected by the control circuit 1221 is some (for example, the operating temperature) of the plurality of operating conditions (for example, the operating temperature, the operating current, and the operating platform voltage) that affect the gate allowable voltage of the semiconductor switching device 11, in a process of determining the gate allowable voltage of the semiconductor switching device 11 based on the operating condition, the control circuit 1221 may determine that the operating conditions that are not detected (for example, the operating current and the operating platform voltage) in the plurality of operating conditions are possible worst conditions, for example, the operating current is a maximum operating current at which the semiconductor switching device 11 may operate, and the operating platform voltage is a maximum operating platform voltage at which the semiconductor switching device 11 may operate, to ensure the reliability of the semiconductor switching device 11 as much as possible.

300. Output a control signal to a driving power supply circuit 1222 based on the gate allowable voltage, to control the driving power supply circuit 1222 to provide a gate on voltage for the semiconductor switching device 11.

After determining the gate allowable voltage of the semiconductor switching device 11, the control circuit 1221 can output a control signal to a driving power supply circuit 1222 based on the determined gate allowable voltage, to control the driving power supply circuit 1222 to provide a gate on voltage that is not higher than the gate allowable voltage and that is positively correlated with the gate allowable voltage for the semiconductor switching device 11.

When the operating condition of the semiconductor switching device 11 is optimized, the gate allowable voltage of the semiconductor switching device is increased correspondingly, the control circuit 1221 outputs the control signal to the driving power supply circuit 1222 based on the gate allowable voltage, and the driving power supply circuit 1222 may be controlled to increase the gate on voltage provided for the semiconductor switching device 11, to shorten the mode switching duration of the semiconductor switching device 11 for switching between the full-on mode and the full-off mode, thereby reducing the loss.

In a possible implementation, the control circuit 1221 may control the driving power supply circuit 1222 to provide a gate on voltage that is the same as the gate allowable voltage for the semiconductor switching device 11, to further increase the gate on voltage, thereby reducing the loss.

Step 200 may be implemented according to any one of the following three ideas: (1) avoid gate breakdown; (2) avoid conduction channel breakdown; and (3) avoid gate breakdown and conduction channel breakdown. The following separately describes steps of step 200 according to the foregoing three ideas.

(1) Avoid Gate Breakdown

In a possible implementation, step 200 may include the following steps.

200A1. Determine a first value of the gate allowable voltage based on the detected operating condition, where the first value is not higher than a gate breakdown voltage of the semiconductor switching device.

The control circuit 1221 can determine the gate allowable voltage that is not higher than a gate breakdown voltage of the semiconductor switching device 11 based on some or all of the detected operating conditions, and a value of the gate allowable voltage determined herein may be referred to as a first value.

In a possible implementation, step 200A1 may include the following steps.

200A11. Determine the gate breakdown voltage of the semiconductor switching device 11 based on the detected operating condition.

The control circuit 1221 can generate the gate breakdown voltage of the semiconductor switching device 11 in response to the operating condition of the semiconductor switching device 11 based on characteristics of the semiconductor switching device 11. When the operating condition is worse, the gate breakdown voltage of the semiconductor switching device 11 is lower. Conversely, when the operating condition is better, the gate breakdown voltage is higher. For example, for a general semiconductor switching device 11, a higher operating temperature of the semiconductor switching device 11 indicates a higher gate breakdown voltage of the semiconductor switching device. Conversely, a lower operating temperature indicates a lower gate breakdown voltage of the semiconductor switching device. Therefore, the control circuit 1221 can determine the gate breakdown voltage of the semiconductor switching device 11 based on a detected operating temperature.

200A12. Determine the first value of the gate allowable voltage based on the gate breakdown voltage and a preset first margin.

To avoid the gate breakdown of the semiconductor switching device 11 as much as possible, the control circuit 1221 can determine the first value of the gate allowable voltage based on the determined gate breakdown voltage and the preset first margin, where the first value is less than the gate breakdown voltage and is positively correlated with the gate breakdown voltage. When the first margin is larger, a difference between the first value of the gate allowable voltage and the gate breakdown voltage is larger, a probability that the gate breakdown occurs on the semiconductor switching device 11 is lower, and the reliability is higher. Conversely, when the first margin is smaller, the difference between the first value of the gate allowable voltage and the gate breakdown voltage is smaller, the first value of the gate allowable voltage is larger, the mode switching duration of the semiconductor switching device 11 is shorter, and the loss is lower. In a possible implementation, the first value may be a difference between the gate breakdown voltage and the first margin.

The control circuit 1221 can determine the first value of the gate allowable voltage of the semiconductor switching device based on the operating condition of the semiconductor switching device 11, to prevent the gate breakdown from occurring on the semiconductor switching device, and when the operating condition becomes better, the first value of the gate allowable voltage determined by the control circuit 1221 is increased, and the control circuit 1221 can control the driving power supply circuit 1222 to provide a higher gate on voltage for the semiconductor switching device 11, to shorten the mode switching duration of the semiconductor switching device 11, thereby reducing the loss.

(2) Avoid Conduction Channel Breakdown

There are generally a parasitic inductor and a parasitic capacitor in the semiconductor switching device 11 and the electronic device 1 in which the semiconductor switching device is located, which causes the semiconductor switching device 11 to oscillate during turning on or turning off. As a result, a voltage spike that is higher than the operating platform voltage of the semiconductor switching device 11 is generated between two ends of the conduction channel of the semiconductor switching device 11. Therefore, even if the operating platform voltage is limited to be not higher than a breakdown voltage between the two ends of the conduction channel of the semiconductor switching device 11, if the voltage spike is higher than the breakdown voltage between the two ends of the conduction channel of the semiconductor switching device 11, the conduction channel breakdown still occurs on the semiconductor switching device 11. It can be seen that the voltage spike between the two ends of the conduction channel of the semiconductor switching device 11 needs to be limited to be not higher than the breakdown voltage between the two ends of the conduction channel of the semiconductor switching device.

The gate driving voltage of the semiconductor switching device 11 affects the voltage spike between the two ends of the conduction channel of the semiconductor switching device. Generally, a higher gate on voltage indicates a higher voltage spike between the two ends of the conduction channel of the semiconductor switching device. Conversely, a lower gate on voltage indicates a lower voltage spike between the two ends of the conduction channel of the semiconductor switching device. Therefore, the gate on voltage provided by the driving power supply circuit 1222 for the semiconductor switching device 11 needs to be limited, to avoid the excessively high voltage spike between the two ends of the conduction channel and the conduction channel breakdown. In addition to the gate driving voltage, the operating condition of the semiconductor switching device 11 such as the operating temperature, the operating current, or the operating platform voltage also affects the voltage spike between the two ends of the conduction channel of the semiconductor switching device. Generally, if a current operating temperature is higher, or a current operating current is larger, or a current operating platform voltage is higher, the voltage spike between the two ends of the conduction channel of the semiconductor switching device 11 is higher, and the conduction channel breakdown is more likely to occur on the semiconductor switching device. Therefore, if the current operating temperature is higher, or the current operating current is larger, or the current operating platform voltage is higher, it may be considered that the current operating condition is worse.

It can be seen that the gate driving voltage and the operating condition of the semiconductor switching device 11 jointly determine the voltage spike between the two ends of the conduction channel of the semiconductor switching device. For the determined operating condition, a gate allowable voltage may be determined based on the breakdown voltage between the two ends of the conduction channel Provided that the gate on voltage is not higher than the gate allowable voltage, the voltage spike between the two ends of the conduction channel is not higher than the breakdown voltage between the two ends of the conduction channel.

In conclusion, in a possible implementation, step 200 may include the following steps.

200B1. Determine a second value of the gate allowable voltage based on an allowable voltage between two ends of a conduction channel of the semiconductor switching device 11 and the detected operating condition.

The control circuit 1221 can determine the gate allowable voltage based on an allowable voltage between the two ends of the conduction channel of the semiconductor switching device 11 and some or all of the detected operating conditions. For ease of distinguishing values of the gate allowable voltage determined according to different methods, the value of the gate allowable voltage determined herein may be referred to as a second value. When the gate allowable voltage is the second value, the voltage spike between the two ends of the conduction channel of the semiconductor switching device 11 is not higher than the allowable voltage between the two ends of the conduction channel of the semiconductor switching device under a current operating condition.

In a possible implementation, step 200B1 may include the following steps.

200B11. Determine the allowable voltage between the two ends of the conduction channel of the semiconductor switching device 11 based on the operating condition.

The control circuit 1221 can determine the allowable voltage between the two ends of the conduction channel of the semiconductor switching device 11 based on some or all of the detected operating conditions, where the allowable voltage between the two ends of the conduction channel of the semiconductor switching device 11 is not higher than the breakdown voltage between the two ends of the conduction channel of the semiconductor switching device.

In a possible implementation, step 200B11 may include the following steps.

200B111. Determine the breakdown voltage between the two ends of the conduction channel based on the operating condition.

200B112. Determine the allowable voltage between the two ends of the conduction channel based on the breakdown voltage between the two ends of the conduction channel and a preset second margin.

The control circuit 1221 can determine the allowable voltage between the two ends of the conduction channel based on the determined breakdown voltage between the two ends of the conduction channel and the preset second margin, where the determined allowable voltage between the two ends of the conduction channel is lower than the breakdown voltage between the two ends of the conduction channel and is positively correlated with the breakdown voltage between the two ends of the conduction channel. When the second margin is larger, a difference between the allowable voltage between the two ends of the conduction channel and the breakdown voltage between the two ends of the conduction channel is larger, a probability that the conduction channel breakdown occurs on the semiconductor switching device 11 is lower, and the reliability is higher. Conversely, when the second margin is smaller, the difference between the allowable voltage between the two ends of the conduction channel and the breakdown voltage between the two ends of the conduction channel is smaller, and the allowable voltage between the two ends of the conduction channel is larger. For the same operating condition, when the second value of the determined gate allowable voltage is higher, the mode switching duration of the semiconductor switching device 11 is shorter, and the loss is lower. In a possible implementation, the allowable voltage between the two ends of the conduction channel may be a difference between the breakdown voltage between the two ends of the conduction channel and the second margin.

The control circuit 1221 can determine the second value of the gate allowable voltage of the semiconductor switching device based on the operating condition of the semiconductor switching device 11 and the allowable voltage between the two ends of the conduction channel of the semiconductor switching device, to avoid the conduction channel breakdown on the semiconductor switching device, and when the operating condition becomes better, the second value of the gate allowable voltage determined by the control circuit 1221 is increased, and the control circuit 1221 can control the driving power supply circuit 1222 to provide a higher gate on voltage for the semiconductor switching device 11, to reduce the mode switching duration of the semiconductor switching device 11, thereby reducing the loss.

(3) Avoid Gate Breakdown and Conduction Channel Breakdown

In a possible implementation, step 200 may include the following steps.

200C1. Determine a first value of the gate allowable voltage based on the operating condition.

For details, reference may be made to the description of any step of step 200 in the first idea. Details are not described herein again.

200C2. Determine a second value of the gate allowable voltage based on an allowable voltage between two ends of a channel of the semiconductor switching device 11 and the operating condition.

For details, reference may be made to the description of any step of step 200 in the second idea. Details are not described herein again.

A time sequence relationship between step 200C1 and step 200C2 is not limited in this embodiment. For example, the control circuit 1221 may perform step 200C1 and step 200C2 in parallel.

200C3. Determine the gate allowable voltage based on a smaller value between the first value and the second value.

To avoid breakdown of the semiconductor switching device 11 as much as possible, the gate allowable voltage should be not higher than the first value determined in step 200C1 and not higher than the second value determined in step 200C2. Therefore, the control circuit 1221 can determine the gate allowable voltage based on a smaller value between the first value and the second value. In a possible implementation, it may be determined that the value of the gate allowable voltage is the smaller value between the first value and the second value.

The control circuit 1221 can determine the first value of the gate allowable voltage based on the operating condition, and when the gate on voltage is not higher than the first value of the gate allowable voltage, the gate breakdown of the semiconductor switching device 11 may be avoided as much as possible. The control circuit 1221 can determine the second value of the gate allowable voltage of the semiconductor switching device based on the operating condition of the semiconductor switching device 11 and the allowable voltage between the two ends of the conduction channel of the semiconductor switching device, and when the gate on voltage is not higher than the second value of the gate allowable voltage, the conduction channel breakdown of the semiconductor switching device 11 may be avoided as much as possible. The control circuit 1221 determines the gate allowable voltage based on the smaller value between the first value and the second value, which is beneficial to avoiding the gate breakdown and the conduction channel breakdown of the semiconductor switching device 11 simultaneously.

Figure 6:
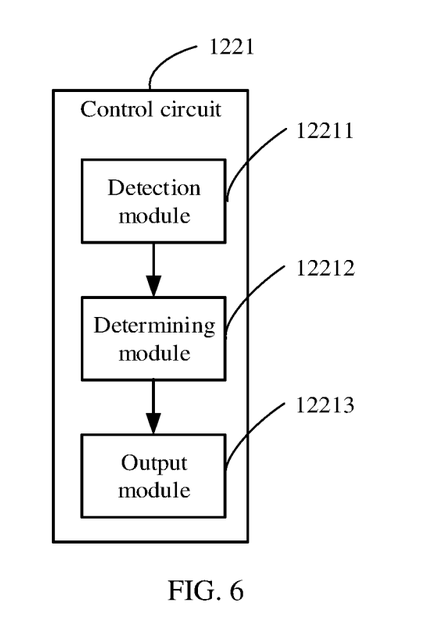
FIG. 6 is a schematic diagram of an embodiment of a control circuit.

The functions of the control circuit 1221 provided in the embodiments are described in the foregoing method embodiments. In the embodiments, the control circuit 1221 may be divided into functional modules according to the foregoing method embodiments. For example, each functional module may be divided corresponding to each function of the control circuit 1221. Alternatively, two or more functions may be integrated into one functional module. FIG. 6 is a schematic structural diagram of a control circuit 1221. As shown in FIG. 6, an embodiment of the control circuit 1221 may include: a detection module 12211, a determining module 12212, and an output module 12213. The detection module 12211 is configured to detect a current operating condition of a semiconductor switching device; the determining module 12212 is configured to determine a gate allowable voltage of the semiconductor switching device based on the operating condition detected by the detection module 12211; and the output module 12213 is configured to output a control signal to a driving power supply circuit of the semiconductor switching device based on the gate allowable voltage determined by the determining module 12212, to control the driving power supply circuit to provide a gate on voltage that is not higher than the gate allowable voltage and that is positively correlated with the gate allowable voltage for the semiconductor switching device.

In a possible implementation, the detection module 12211 may include a sensor configured to detect the operating condition (for example, an operating temperature), or may include a sampling device configured to collect an operating current and/or an operating platform voltage, or may include a sensor and a sampling device, or may include a communications interface, configured to receive information about the operating condition.

Figure 7:
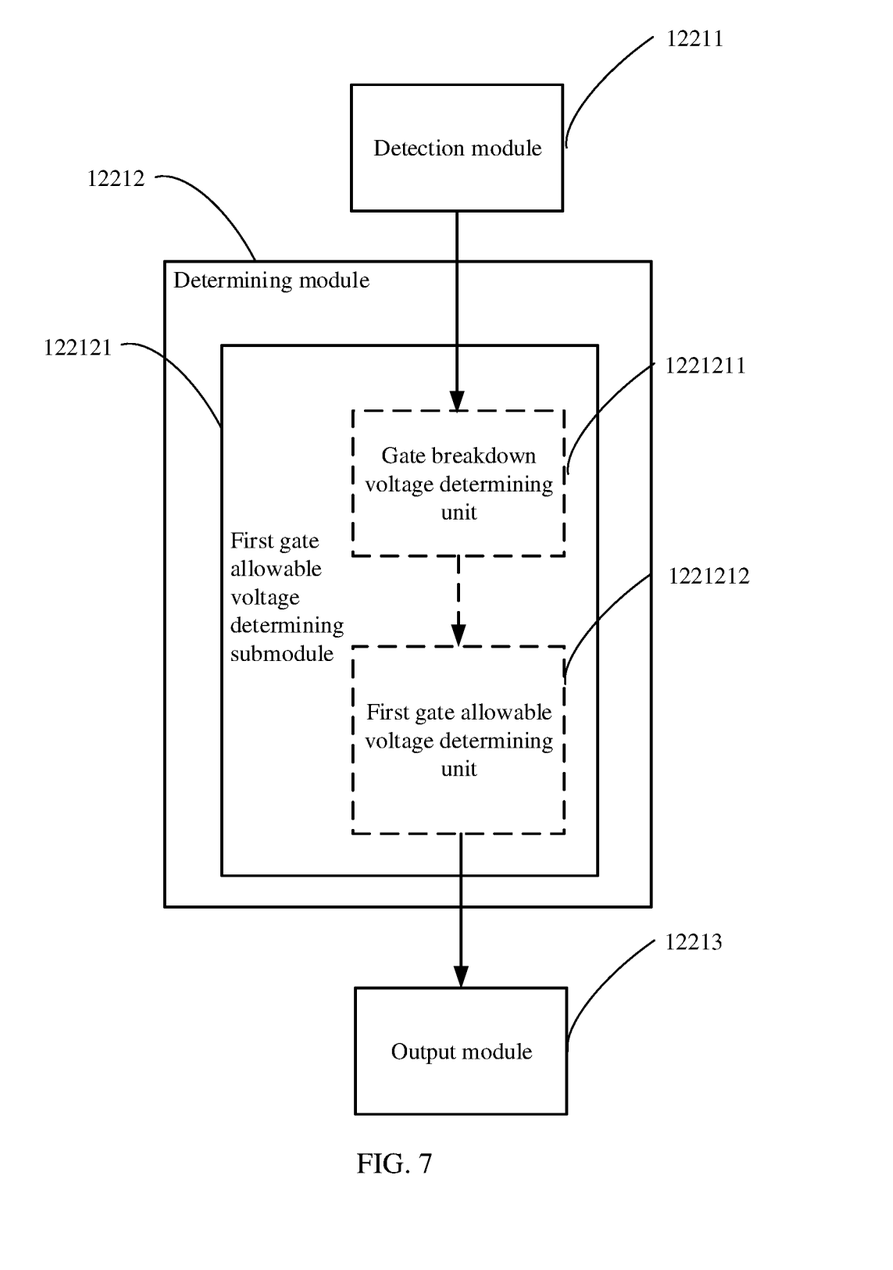
FIG. 7 is a schematic diagram of another embodiment of a control circuit.

Referring to FIG. 7, in some embodiments, the determining module 12212 includes a first gate allowable voltage determining submodule 122121, configured to determine a first value of the gate allowable voltage based on the operating condition detected by the detection module 12211, where the first value is not higher than a gate breakdown voltage of the semiconductor switching device.

Still referring to FIG. 7, in some embodiments, the first gate allowable voltage determining submodule 122121 includes a gate breakdown voltage determining unit 1221211 and a first gate allowable voltage determining unit 1221212. The gate breakdown voltage determining unit 1221211 is configured to determine the gate breakdown voltage of the semiconductor switching device based on the operating condition detected by the detection module 12211; and the first gate allowable voltage determining unit 1221212 is configured to determine the first value based on the gate breakdown voltage determined by the gate breakdown voltage determining unit 1221211 and a preset first margin.

Figure 8:
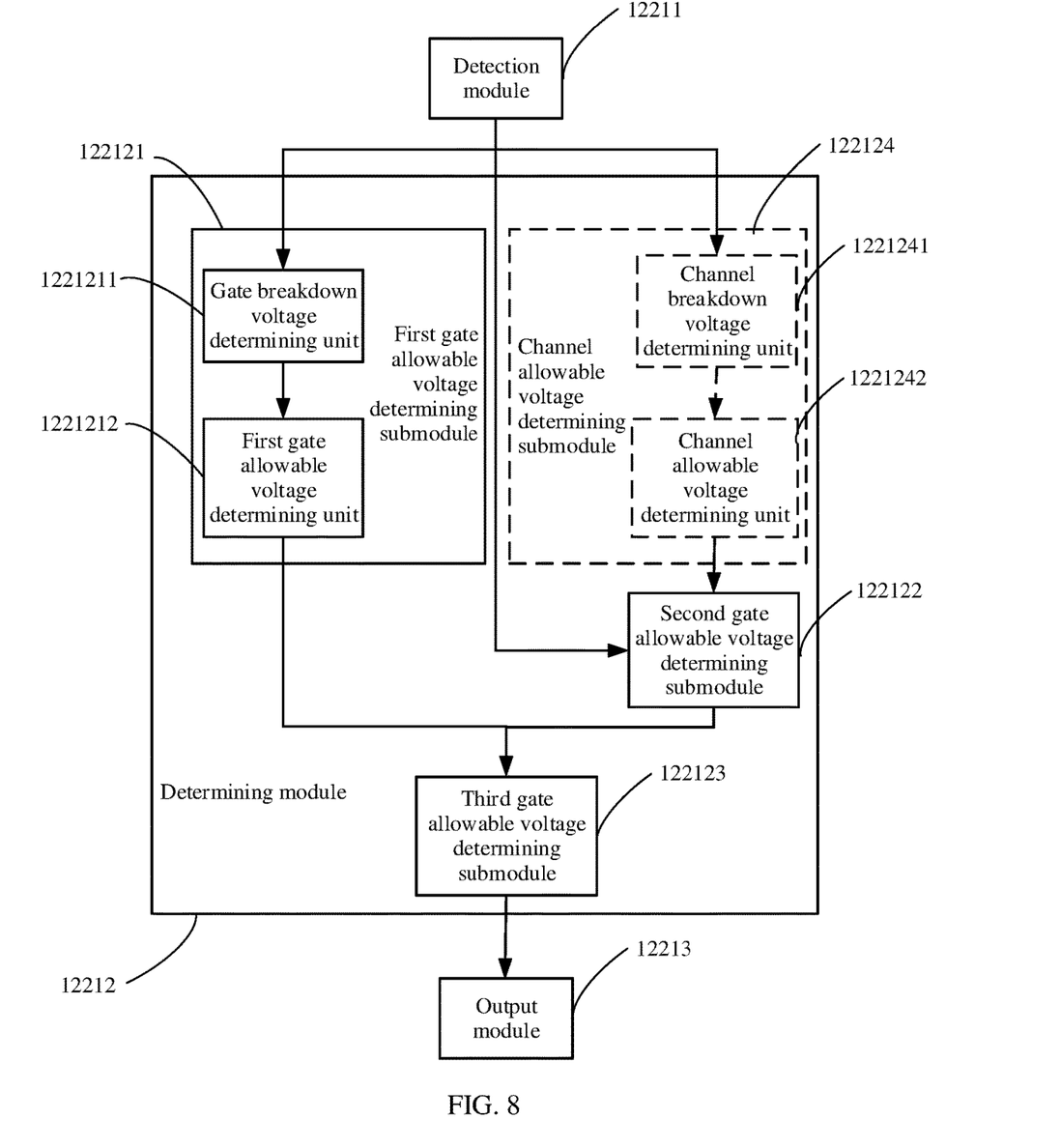
FIG. 8 is a schematic diagram of another embodiment of a control circuit.

Referring to FIG. 8, in some embodiments, the determining module 12212 further includes a second gate allowable voltage determining submodule 122122 and a third gate allowable voltage determining submodule 122123. The second gate allowable voltage determining submodule 122122 is configured to determine a second value of the gate allowable voltage based on an allowable voltage between two ends of a conduction channel of the semiconductor switching device and the operating condition detected by the detection module 12211; and the third gate allowable voltage determining submodule 122123 is configured to determine the gate allowable voltage based on a smaller value between the first value determined by the first gate allowable voltage determining submodule 122121 and the second value determined by the second gate allowable voltage determining submodule 122122.

Still referring to FIG. 8, in some embodiments, the determining module 12212 further includes a channel allowable voltage determining submodule 122124, configured to determine an allowable voltage between the two ends of the conduction channel based on the operating condition detected by the detection module 12211, where the allowable voltage between the two ends of the conduction channel is not higher than a breakdown voltage between the two ends of the conduction channel.

Still referring to FIG. 8, in some embodiments, the channel allowable voltage determining submodule 122124 includes a channel breakdown voltage determining unit 1221241 and a channel allowable voltage determining unit 1221242. The channel breakdown voltage determining unit 1221241 is configured to determine the breakdown voltage between the two ends of the conduction channel based on the operating condition detected by the detection module 12211; and the channel allowable voltage determining unit 1221242 is configured to determine the allowable voltage between the two ends of the conduction channel based on the breakdown voltage between the two ends of the conduction channel determined by the channel breakdown voltage determining unit 1221241 and a preset second margin.

The functional modules in the control circuit 1221 may refer to one or more of a specific application integrated circuit, a processor and a memory that execute one or more software or firmware programs, an integrated logic circuit, and another device that can provide the foregoing functions.

For example, some or all of the functional modules in the control circuit 1221 may be implemented by a digital lookup table and/or a digital comparator.

In a possible implementation, the first gate allowable voltage determining submodule 122121 may include a digital lookup table. For ease of distinguishing, the digital lookup table that implements the function of the first gate allowable voltage determining submodule 122121 is referred to as a first gate allowable voltage lookup table. The lookup table is configured to search for a first value of a gate allowable voltage corresponding to a current operating condition.

In a possible implementation, the second gate allowable voltage determining submodule 122122 may include a digital lookup table. For ease of distinguishing, the digital lookup table that implements the function of the second gate allowable voltage determining submodule 122122 is referred to as a second gate allowable voltage lookup table. The lookup table is configured to search for the allowable voltage between the two ends of the conduction channel of the semiconductor switching device 11 and a second value of the gate allowable voltage corresponding to the current operating condition.

In a possible implementation, the third gate allowable voltage determining submodule 122123 may include a digital comparator, and the digital comparator is configured to compare the first value with the second value of the gate allowable voltage, to determine a smaller value.

In a possible implementation, the output module 12213 may include a digital lookup table. For ease of distinguishing, the digital lookup table that implements the function of the output module 12213 is referred to as a control signal lookup table. The control signal lookup table may be configured to determine a control signal, and the control signal output by the control circuit 1221 may be a duty cycle signal, a phase shift signal, a frequency modulation signal, or the like, provided that the driving power supply circuit 1222 can be controlled to adjust a provided gate on voltage. Assuming that the control signal is the duty cycle signal, for example, when the value of the gate allowable voltage determined by the determining module 12212 is relatively large, a duty cycle corresponding to the gate allowable voltage is relatively high in the control signal lookup table; and when the value of the gate allowable voltage determined by the determining module 12212 is relatively small, the duty cycle corresponding to the gate allowable voltage is relatively low in the control signal lookup table.

Figure 9:
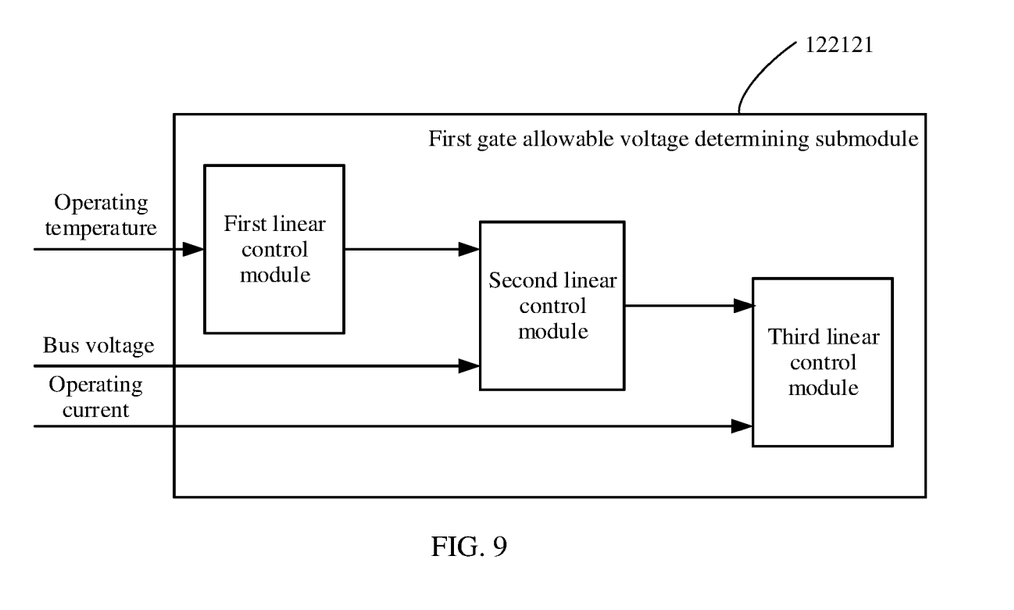
FIG. 9 is a schematic diagram of an embodiment of a first gate allowable voltage determining submodule in a control circuit.

A correspondence between an output and an input in each digital lookup table may be monotonic or non-monotonic. This correspondence is determined based on characteristics of a specific semiconductor switching device 11 and characteristics of an electronic device 1 (for example, a switching power supply) in which the semiconductor switching device is located. If the correspondence between the output and the input in the digital lookup table is monotonic, the digital lookup table may be alternatively replaced with a linear control module in which an input and an output satisfy a superposition principle. For example, if a correspondence between the first value of the gate allowable voltage and the operating condition is monotonic, in a possible implementation, the first gate allowable voltage determining submodule 122121 may alternatively include the linear control module. If there is one operating condition, the first gate allowable voltage determining submodule 122121 may be formed by a single-stage linear control module, and if there are a plurality of operating conditions (for example, three), the first gate allowable voltage determining submodule 122121 may be formed by a plurality of cascaded linear control modules (for example, three cascaded linear control modules), and each linear control module corresponds to one operating condition. Assuming that the operating condition on which the first gate allowable voltage determining submodule 122121 is based includes the operating temperature, the operating platform voltage, and the operating current, for a structure of the first gate allowable voltage determining submodule 122121, reference may be made to FIG. 9. The first gate allowable voltage determining submodule 122121 includes a first linear control module, a second linear control module, and a third linear control module. The first linear control module is configured to output a first intermediate value of the gate allowable voltage to the second linear control module based on the operating temperature, the second linear control module is configured to output a second intermediate value of the gate allowable voltage to the third linear control module based on the operating platform voltage and the first intermediate value of the gate allowable voltage, and the third linear control module is configured to output the first value of the gate allowable voltage based on the operating current and the second intermediate value of the gate allowable voltage. Similarly, if a correspondence between the second value of the gate allowable voltage and the operating condition is monotonic, in a possible implementation, the second gate allowable voltage determining submodule 122122 may alternatively include the linear control module. If the correspondence between the value of the gate allowable voltage and the control signal is monotonic, in a possible implementation, the output module 12213 may include the linear control module. The linear control module in this embodiment may be implemented by a digital circuit or may be implemented by an analog circuit. This is not limited herein.

Figure 10:
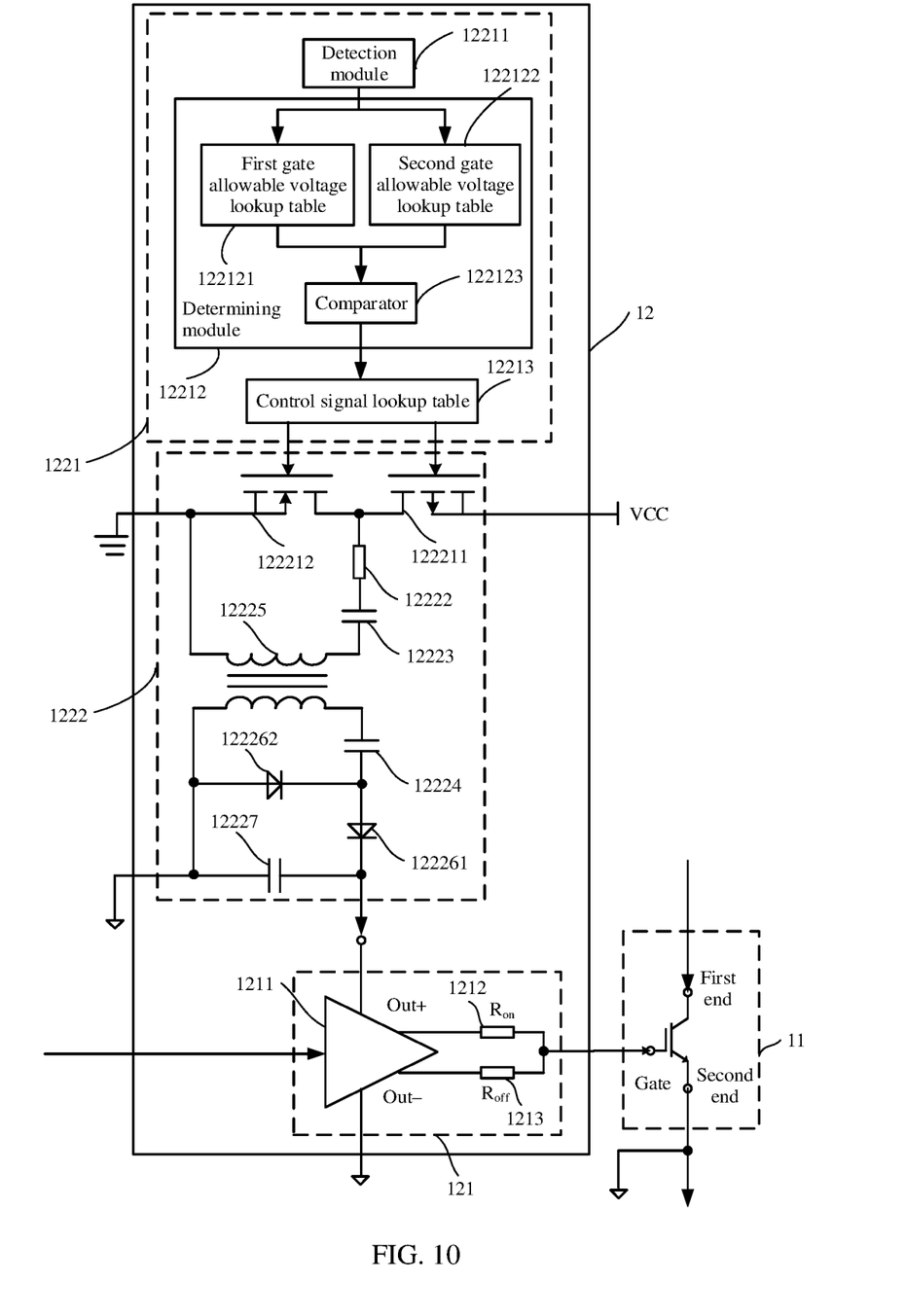
FIG. 10 is a schematic diagram of another embodiment of an electronic device.

FIG. 10 is another schematic structural diagram of an electronic device 1 according to an embodiment. As shown in FIG. 10, in another embodiment of the electronic device 1 provided in this embodiment, the semiconductor switching device 11 is an IGBT, and the driving device 12 includes a driving circuit 121, a control circuit 1221, and a driving power supply circuit 1222.

The control circuit 1221 includes a detection module 12211, a determining module 12212, and a control signal lookup table 12213, where the determining module 12212 includes a first gate allowable voltage lookup table 122121, a second gate allowable voltage lookup table 122122, and a comparator 122123. The detection module 12211 is configured to detect an operating condition of the semiconductor switching device 11, and output the detected operating condition to the first gate allowable voltage lookup table and the second gate allowable voltage lookup table; the first gate allowable voltage lookup table is configured to search for a first value of the gate allowable voltage corresponding to the operating condition, and output the first value to the comparator, and the second gate allowable voltage lookup table is configured to search for a second value of the gate allowable voltage corresponding to the operating condition, and output the second value to the comparator; the comparator is configured to compare the first value of the gate allowable voltage with the second value of the gate allowable voltage, to determine a smaller value between the first value and the second value as a value of the gate allowable voltage, and output the determined value of the gate allowable voltage to the control signal lookup table 12213; and the control signal lookup table 12213 is configured to search for a duty cycle corresponding to the value of the gate allowable voltage, shift the found duty cycle by 180 degrees, and then form a pair of two duty cycles, and output the pair of duty cycles as a control signal to the driving power supply circuit 1222.

The driving power supply circuit 1222 is formed by a half-bridge circuit with a transformer. For example, the driving power supply circuit 1222 includes a half-bridge arm, a buffer resistor 12222, a primary-side DC blocking capacitor 12223, a secondary-side DC blocking capacitor 12224, a transformer 12225, a rectifier bridge arm, and a rectifier capacitor 12227. The half-bridge arm includes two MOSFETs connected in series, a drain electrode of a high-side MOSFET 122211 is connected to a voltage source VCC, where the VCC is a constant DC voltage source, a source electrode of a low-side MOSFET 122212 is connected to a primary-side ground level, and a source electrode of the high-side MOSFET 122211 is connected to a drain electrode of the low-side MOSFET 122212. An intermediate node between the two MOSFETs connected in series is connected to one end of the buffer resistor 12222, the other end of the buffer resistor 12222 is connected to one end of the primary-side DC blocking capacitor 12223, the other end of the primary-side DC blocking capacitor 12223 is connected to one end of a primary side of the transformer 12225, and the other end of the primary side of the transformer 12225 is connected to the ground level. The rectifier bridge arm includes two diodes connected in series, an anode of a high-side diode 122261 is connected to a cathode of a low-side diode 122262, and an intermediate node between the two diodes connected in series is connected to one end of the secondary-side DC blocking capacitor 12224, the other end of the secondary-side DC blocking capacitor 12224 is connected to one end of a secondary side of the transformer 12225, and the other end of the transformer 12225 is connected to an anode of the low-side diode 122262. A cathode of the high-side diode 122261 is connected to one end of the rectifier capacitor 12227, and the other end of the low-side diode 122262 is connected to the other end of the rectifier capacitor 12227.

The high-side MOSFET 122211 and the low-side MOSFET 122212 of the half-bridge arm receive a pair of duty cycle control signals output by the control circuit 1221. When the control signal received by the high-side MOSFET 122211 is valid, the high-side MOSFET 122211 is turned on, and one end of the buffer resistor 12222 is connected to the VCC. When the control signal received by the low-side MOSFET 122212 is valid, the low-side MOSFET 122212 is turned on, and one end of the buffer resistor 12222 is connected to the primary-side ground level. Therefore, the half-bridge arm passes through the buffer resistor 12222 and the primary-side DC blocking capacitor 12223 and generates a pulse voltage corresponding to a current duty cycle on the primary side of the transformer 12225. The secondary side of the transformer 12225 induces the pulse voltage generated by the primary side, and the pulse voltage passes through the secondary-side DC blocking capacitor 12224, the rectifier bridge arm, and the rectifier capacitor 12227 to obtain a DC voltage corresponding to the current duty cycle. Two endpoints of the rectifier capacitor 12227 serve as two output endpoints of the driving power supply circuit 1222 to output the DC voltage, that is, an adjusted gate driving voltage.

The driving circuit 121 includes a buffer driver 1211, an on resistor (recorded as Ron) 1212, and an off resistor (recorded as Roff) 1213. The buffer driver 1211 includes a signal input end, two power supply input ends, and two power supply output ends. The signal input end of the buffer driver 1211 is configured to receive a control signal; one power supply input end of the buffer driver 1211 is connected to an output end of the driving power supply circuit 1222 for receiving the gate on voltage provided by the driving power supply circuit 1222, and is connected to the gate of the semiconductor switching device 11 through the Ron 1212 by one power supply output end (recorded as Out+) of the buffer driver 1211; and the other power supply input end of the buffer driver 1211 is connected to the other end of the rectifier capacitor 12227, and is connected to the gate of the semiconductor switching device 11 through the Roff 1213 by the other power supply output end (recorded as Out−) of the buffer driver 1211. When the buffer driver 1211 receives an on control signal, the power supply output end Out+ of the buffer driver 1211 is valid, and the power supply output end Out− is invalid. The driving circuit 121 outputs the gate on voltage provided by the driving power supply circuit 1222 to the gate and the second end of the semiconductor switching device 11 through the Ron 1212, to drive the semiconductor switching device 11 to be turned on. When the buffer driver 1211 receives an off control signal, the power supply output end Out− of the buffer driver 1211 is valid, and the power supply output end Out+ is invalid. The driving circuit 121 outputs the gate off voltage to the gate and the second end of the semiconductor switching device 11 through the Roff 1213 to drive the semiconductor switching device 11 to be turned off.

It should be noted that the foregoing embodiments are merely illustrative. During actual use, the driving power supply circuit 1222, the driving circuit 121, the control circuit 1221, and the semiconductor switching device 11 may be alternatively implemented by using other circuit structures.

The solutions provided in the embodiments are described in detail above. The principle and implementation are described herein through various examples. The description about the embodiments is merely provided to help understand the method and core ideas. In addition, a person of ordinary skill in the art can make variations and modifications to the embodiments in terms of the specific implementations and application scopes according to the ideas. Therefore, the content of the embodiments shall not be construed as limiting.

What is claimed is:

1. A control circuit, comprising:
a detection module configured to detect a current operating condition of a semiconductor switching device;
a determining module configured to determine a gate allowable voltage of the semiconductor switching device based on the operating condition detected by the detection module; and
an output module configured to output a control signal to a driving power supply circuit of the semiconductor switching device based on the gate allowable voltage determined by the determining module, to control the driving power supply circuit to provide a gate on voltage that is not higher than the gate allowable voltage and that is positively correlated with the gate allowable voltage for the semiconductor switching device,
wherein the determining module comprises a first gate allowable voltage determining submodule configured to determine a first value of the gate allowable voltage based on the operating condition detected by the detection module, wherein the first value is not higher than a gate breakdown voltage of the semiconductor switching device, and
the first gate allowable voltage determining submodule comprises:
a gate breakdown voltage determining unit configured to determine the gate breakdown voltage of the semiconductor switching device based on the operating condition detected by the detection module; and
a first gate allowable voltage determining unit configured to determine the first value based on the gate breakdown voltage determined by the gate breakdown voltage determining unit and a preset first margin.

2. The control circuit according to claim 1, wherein the determining module further comprises:
a second gate allowable voltage determining submodule configured to determine a second value of the gate allowable voltage based on an allowable voltage between two ends of a conduction channel of the semiconductor switching device and the operating condition detected by the detection module; and
a third gate allowable voltage determining submodule configured to determine the gate allowable voltage based on a smaller value between the first value determined by the first gate allowable voltage determining submodule and the second value determined by the second gate allowable voltage determining submodule.

3. The control circuit according to claim 2, wherein the determining module further comprises:
a channel allowable voltage determining submodule configured to determine the allowable voltage between the two ends of the conduction channel based on the operating condition detected by the detection module, wherein the allowable voltage between the two ends of the conduction channel is not higher than a breakdown voltage between the two ends of the conduction channel.

4. The control circuit according to claim 3, wherein the channel allowable voltage determining submodule comprises:
a channel breakdown voltage determining unit configured to determine the breakdown voltage between the two ends of the conduction channel based on the operating condition detected by the detection module; and
a channel allowable voltage determining unit configured to determine the allowable voltage between the two ends of the conduction channel based on the breakdown voltage between the two ends of the conduction channel determined by the channel breakdown voltage determining unit and a preset second margin.

5. The control circuit according to claim 2, wherein the semiconductor switching device is a metal oxide semiconductor field effect transistor (MOSFET), and the two ends of the conduction channel comprise a drain electrode and a source electrode of the MOSFET; or the semiconductor switching device is an insulated gate bipolar transistor (IGBT), and the two ends of the conduction channel comprise a collector and an emitter of the IGBT.

6. The control circuit according to claim 1, wherein the operating condition comprises an operating temperature of the semiconductor switching device, or an operating temperature and an operating current of the semiconductor switching device, or an operating temperature and an operating platform voltage of the semiconductor switching device, or an operating temperature, an operating current, and an operating platform voltage of the semiconductor switching device.

7. A method for driving a semiconductor switching device, comprising:
   obtaining, by a control circuit, a current operating condition of a semiconductor switching device;
   determining, by the control circuit, a gate allowable voltage of the semiconductor switching device based on the operating condition; and
   outputting, by the control circuit, a control signal to a driving power supply circuit of the semiconductor switching device based on the gate allowable voltage, to control the driving power supply circuit to provide a gate on voltage that is not higher than the gate allowable voltage and that is positively correlated with the gate allowable voltage for the semiconductor switching device
   wherein the determining, by the control circuit, of a gate allowable voltage of the semiconductor switching device based on the operating condition comprises:
   determining, by the control circuit, a first value of the gate allowable voltage based on the operating condition, wherein the first value is not higher than a gate breakdown voltage of the semiconductor switching device, and
   the determining, by the control circuit, of the first value of the gate allowable voltage based on the operating condition comprises:

determining, by the control circuit, the gate breakdown voltage of the semiconductor switching device based on the operating condition; and
determining, by the control circuit, the first value based on the gate breakdown voltage and a preset first margin.

8. The method according to claim 7, further comprising:
   determining, by the control circuit, a second value of the gate allowable voltage based on an allowable voltage between two ends of a conduction channel of the semiconductor switching device and the operating condition; and
   determining, by the control circuit, the gate allowable voltage based on a smaller value between the first value and the second value.

9. The method according to claim 8, further comprising:
   determining, by the control circuit, the allowable voltage between the two ends of the conduction channel based on the operating condition, wherein the allowable voltage between the two ends of the conduction channel is not higher than a breakdown voltage between the two ends of the conduction channel.

10. The method according to claim 9, wherein the determining, by the control circuit, of the allowable voltage between the two ends of the conduction channel based on the operating condition comprises:
    determining, by the control circuit, the breakdown voltage between the two ends of the conduction channel based on the operating condition; and
    determining, by the control circuit, the allowable voltage between the two ends of the conduction channel based on the breakdown voltage between the two ends of the conduction channel and a preset second margin.

11. The method according to claim 8, wherein the semiconductor switching device is a metal oxide semiconductor field effect transistor (MOSFET), and the two ends of the conduction channel comprise a drain electrode and a source electrode of the MOSFET; or
    the semiconductor switching device is an insulated gate bipolar transistor (IGBT), and the two ends of the conduction channel comprise a collector and an emitter of the IGBT.

12. The method according to claim 7, wherein the operating condition comprises an operating temperature of the semiconductor switching device, or an operating temperature and an operating current of the semiconductor switching device, or an operating temperature and an operating platform voltage of the semiconductor switching device, or an operating temperature, an operating current, and an operating platform voltage of the semiconductor switching device.

* * * * *